US012693360B2

(12) United States Patent
Wiesinger et al.

(10) Patent No.: US 12,693,360 B2
(45) Date of Patent: Jul. 28, 2026

(54) SYSTEM AND METHOD FOR IMPROVED SILENT MULTI-GRADIENT ECHO MAGNETIC RESONANCE IMAGING

(71) Applicant: GE Precision Healthcare LLC, Waukesha, WI (US)

(72) Inventors: Florian Wiesinger, Freising (DE); Ana Beatriz Solana Sanchez, Munich (DE)

(73) Assignee: GE Precision Healthcare LLC, Waukesha, WI (US)

( * ) Notice: Subject to any disclaimer, the term of this patent is extended or adjusted under 35 U.S.C. 154(b) by 352 days.

(21) Appl. No.: 18/602,249

(22) Filed: Mar. 12, 2024

(65) Prior Publication Data
US 2025/0291011 A1 Sep. 18, 2025

(51) Int. Cl.
*G01R 33/48* (2006.01)
*G01R 33/561* (2006.01)

(52) U.S. Cl.
CPC ..... *G01R 33/4826* (2013.01); *G01R 33/4816* (2013.01); *G01R 33/4818* (2013.01); *G01R 33/5616* (2013.01); *G01R 33/5611* (2013.01)

(58) Field of Classification Search
CPC ............ G01R 33/4816; G01R 33/4818; G01R 33/4824; G01R 33/4826; G01R 33/5608; G01R 33/5611; G01R 33/5616; G01R 33/58
See application file for complete search history.

(56) References Cited

U.S. PATENT DOCUMENTS

| | | | | |
|---|---|---|---|---|
| 6,476,607 | B1 * | 11/2002 | Dannels ............. | G01R 33/4833 |
| | | | | 324/309 |
| 10,088,539 | B2 | 10/2018 | Wiesinger et al. | |
| 11,550,013 | B2 | 1/2023 | Wiesinger et al. | |
| 2005/0073303 | A1 * | 4/2005 | Harer ................. | G01R 33/4824 |
| | | | | 324/309 |
| 2017/0307703 | A1 * | 10/2017 | Wiesinger .......... | G01R 33/5616 |
| 2018/0204358 | A1 * | 7/2018 | An ......................... | A61B 5/055 |
| 2020/0309883 | A1 * | 10/2020 | Ding .................. | G01R 33/4826 |
| 2021/0231761 | A1 * | 7/2021 | Eggers ............... | G01R 33/4824 |
| 2021/0263119 | A1 * | 8/2021 | Lyu ..................... | G01R 33/4822 |
| 2022/0099776 | A1 * | 3/2022 | Wiesinger .......... | G01R 33/5608 |

(Continued)

OTHER PUBLICATIONS

Weisinger, et al., Looping Star, Magn Reson Med. 2019; 81: 57-68 (Year: 2019).*

(Continued)

*Primary Examiner* — Steven L Yeninas
(74) *Attorney, Agent, or Firm* — Fletcher Yoder, P.C.

(57) ABSTRACT
Methods and systems for production of silent, multi-gradient echo, magnetic resonance images includes employing iterative application of small updates to the magnetic field gradient followed by a short, non-selective radiofrequency pulse excitation and for free indication decay data acquisition. The magnetic field gradient updates allow for silent, self-refocusing pulse sequence. Each magnetic field gradient is based in part on a k-space spoke. The multiple spokes, when concatenated, produce a closed k-space trajectory, which results in the self-refocusing pulse sequence. The k-space spokes of the sequence of k-space spokes that forms the closed k-space trajectory oscillate in and out of a plane of a frequency space. Subsequent applications of the magnetic field gradients allow for multiple echo data acquisitions.

20 Claims, 10 Drawing Sheets

(56) References Cited

U.S. PATENT DOCUMENTS

| | | | |
|---|---|---|---|
| 2023/0366966 A1* | 11/2023 | Xiang | G01R 33/4806 |
| 2024/0077566 A1* | 3/2024 | Kutsuna | G01R 33/56509 |
| 2024/0192297 A1* | 6/2024 | Beck | G01R 33/482 |
| 2024/0201298 A1* | 6/2024 | Ersoz | G01R 33/4824 |

OTHER PUBLICATIONS

Dionisio-Parra et al., Looping Star fMRI in Cognitive Tasks and Resting State, J. Magn. Reson. Imaging 2020;52:739â751 (Year: 2020).*

Ljungberg et al., "Silent zero TE MR neuroimaging: Current state-of-the-art and future directions," Progress in Nuclear Magnetic Ressonance Spectroscopy, Elsevier, Mar. 2021, 21 pgs.

Damestani et al., "Revealing the mechanisms behind novel auditory stimuli discrimination: An evaluation of silent functional MRI using looping star," Wiley, Mar. 2021, 18 pgs.

Wiesinger et al. "Looping Star: Revisiting echo in/out separation," 2020, 3 pgs.

Dionisio-Parra, MSc et al., Looping Star fMRI in Cognitive Tasks and Resting State, J. Magn. Reson. 2020, 13 pgs.

Wiesinger et al., "Looping Star," Magnetic Resonance in Medicine, 2018, 12 pgs.

* cited by examiner

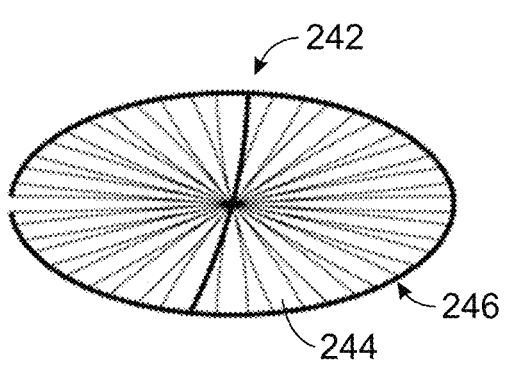
FIG. 5
FIG. 6
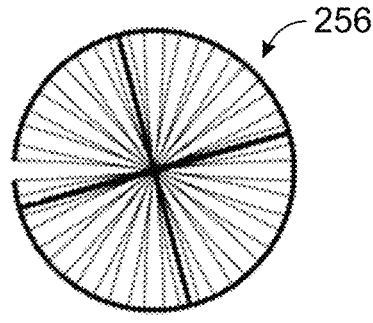
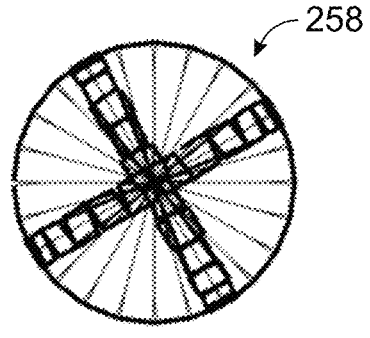
FIG. 7
FIG. 8
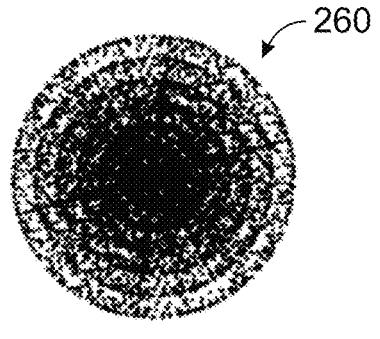
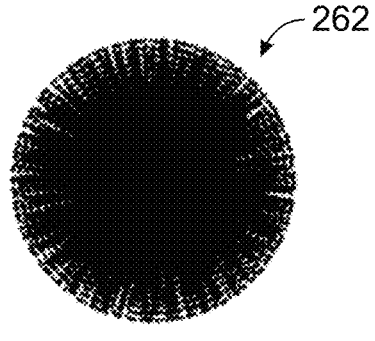
FIG. 9
FIG. 10

264

264

266

SYSTEM AND METHOD FOR IMPROVED SILENT MULTI-GRADIENT ECHO MAGNETIC RESONANCE IMAGING

BACKGROUND

The subject matter disclosed herein relates to medical imaging and, more particularly, to a system and method for improved silent multi-gradient echo magnetic resonance imaging.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Looping Star is a novel time-multiplexed, multi-gradient echo (GRE) MR acquisition scheme. Its singular features include quiet scanning ($\leq$15 decibels A (dBA) with scanner ambient acoustic noise), three-dimensional (3D) isotropic image encoding, high sampling efficiency, and acquisition of free-induction decay (FID) image. Looping Star has been utilized in functional MR imaging (e.g., T2* BOLD functional MRI (fMRI)) and high resolution susceptibility weighted structural MR imaging.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for silent multi-gradient echo magnetic resonance imaging is provided. The computer-implemented method includes acquiring, via a processor, a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a 3D k-space. An iteration of the FID acquisition process includes updating a magnetic field gradient based on a k-space spoke of the sequence of k-space spokes corresponding to the iteration of the FID acquisition process, applying a radiofrequency excitation pulse while preserving a total magnetic field gradient to encode the k-space spoke corresponding to the iteration of the FID acquisition process, and acquiring a first dataset corresponding to the k-space spoke corresponding to the iteration of the FID acquisition process, wherein the first dataset is at least a portion of the FID dataset. An interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

In another embodiment, a system for silent multi-gradient echo magnetic resonance imaging is provided. The system includes a memory encoding processor-executable routines. The system also includes a processor configured to access the memory and to execute the processor-executable routines, wherein the processor-executable routines, when executed by the processor, cause the processor to perform actions. The actions include acquiring a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a 3D k-space. An iteration of the FID acquisition process includes updating a magnetic field gradient based on a k-space spoke of the sequence of k-space spokes corresponding to the iteration of the FID acquisition process, applying a radiofrequency excitation pulse while preserving a total magnetic field gradient to encode the k-space spoke corresponding to the iteration of the FID acquisition process, and acquiring a first dataset corresponding to the k-space spoke corresponding to the iteration of the FID acquisition process, wherein the first dataset is at least a portion of the FID dataset. An interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

In a further embodiment, a non-transitory computer-readable medium, the computer-readable medium including processor-executable code that when executed by a processor, causes the processor to perform actions. The actions include acquiring a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a 3D k-space. An iteration of the FID acquisition process includes updating a magnetic field gradient based on a k-space spoke of the sequence of k-space spokes corresponding to the iteration of the FID acquisition process, applying a radiofrequency excitation pulse while preserving a total magnetic field gradient to encode the k-space spoke corresponding to the iteration of the FID acquisition process, and acquiring a first dataset corresponding to the k-space spoke corresponding to the iteration of the FID acquisition process, wherein the first dataset is at least a portion of the FID dataset. An interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein:

FIG. 5 illustrates a schematic diagram of a conventional Looping Star trajectory for a single loop;

FIG. 6 illustrates a schematic diagram of a Wave Looping Star trajectory for a single loop, in accordance with aspects of the present disclosure;

FIG. 7 illustrates a schematic diagram of a conventional Looping Star trajectory for the first three loops;

FIG. 8 illustrates a schematic diagram of a Wave Looping Star trajectory for the first three loops, in accordance with aspects of the present disclosure;

FIG. 9 illustrates a schematic diagram of a conventional Looping Star trajectory for one volume (i.e., 32 k-space loops);

FIG. 10 illustrates a schematic diagram of a Wave Looping Star trajectory for one volume (i.e., 32 k-space loops), in accordance with aspects of the present disclosure;

DETAILED DESCRIPTION

Figure 1:
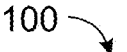
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

In the descriptions below, it must be appreciated that the term "loop" may have two different meanings. In some situations, a "loop" may refer to a closed trajectory in a frequency space (or k-space). In other situations, "loop" refers to a part of a method that may be repeated. The meaning intended should be clear from the context.

Magnetic resonance imaging (MRI) uses systems capable of producing an image that maps specific properties of gyromagnetic materials of the object being imaged. More specifically, MRI systems measure the RF emission from gyromagnetic nuclei of the objects being imaged as a response to magnetic field perturbations created by coils of the MRI system. Usually, the object is immersed in a strong constant magnetic field and is subject to variable magnetic field gradients and RF excitation pulses. The RF emission may be sensed at pre-defined acquisition times.

From the data obtained from an MRI system, multiple types of images may be obtained. Examples of types of images include intensity images, complex (magnitude and phase) images, T1, T2 or T2*-weighted images, T1, T2 or T2* maps, and R1, R2 or R2* maps, with R1 representing the inverse of T1, R2 the inverse of T2 and R2* the inverse of T2*. Based on the type of image being created, a custom pulse sequence that enables acquisition of appropriate data with the MRI system may be applied.

The present disclosure enables an MRI system to produce 3D images using a silent, multi-gradient echo pulse sequence. The sequence may use a collection of datasets corresponding to a segment of the frequency space or k-space. Each segment of k-space may include multiple center-out spokes. The set of spokes of one segment may be produced using an acquisition trajectory resembling a looping geometry, which allows self-refocusing of the signals, as detailed below. For each segment, a dataset corresponding to FID and gradient echoes may be collected. The dataset related to the volume of the entire k-space of interest may be obtained by sampling multiple segments.

For each segment (a collection of k-space spokes), a segment pulse sequence (e.g., referred to as Looping Star) may be applied. The segment pulse sequence may use a spatial encoding technique in which an RF excitation pulse may occur while a magnetic field gradient corresponding to a spoke of the segment is being applied. The technique may initially generate a certain number of free induction decay (FID) datasets resulting from the RF excitation pulses. Each FID dataset may be obtained through acquisition that starts immediately following the RF excitation pulse (TE=0). The application of all magnetic field gradients during the FID dataset acquisition may allow refocusing of the initial RF excitation pulse. Thus, a repeated application of the same magnetic fields in the same order as the one during the FID dataset acquisition, but without RF pulses, may allow acquisition of a gradient echo dataset with echo time TE=TE1. Subsequent gradient echo datasets may be obtained similarly, with echo times TE=2*TE, 3*TE, and so on.

The small magnetic field gradient updates that may be used in accordance with present embodiments may reduce the large change in the strong currents applied to the coils of the MRI system. As a result, the use of the techniques presented herein may lead to significantly reduced acoustic noise of the MRI system during operation. Acoustic noise due to changes in the coil currents and associated switching within the circuitry may disturb a patient going through a medical imaging process. In medical diagnostic techniques, such as during a functional magnetic resonance imaging (fMRI), this disturbance to the patient may interfere with the results of the diagnostic procedure. For example, when an association between brain activity and a cognitive function is being evaluated during an fMRI acquisition, the acoustic noise level may impact the cognitive function of the patient. As detailed below, the acoustic noise during operation within the bore, where the patient is situated, may be similar to the background noise before imaging is performed.

Looping Star may be utilized in typical used for mGRE (Dixon-type fat-water imaging, susceptibility weighted imaging, quantitative susceptibility mapping, spectroscopic chemical shift imaging) and silent MR imaging (e.g., pediatric, geriatric, hyperacusis, etc.). Looping Star may also be utilized with functional MRI (e.g., silent functional BOLD fMRI) to provide advantages over standard loud echo planar imaging-based methods. The techniques described herein may be utilized with the techniques for Looping Star described in U.S. Pat. No. 10,088,539, entitled "SILENT MULTI-GRADIENT ECHO MAGNETIC RESONANCE IMAGING", issued Oct. 2, 2018, and U.S. Pat. No. 11,550, 013, entitled "SYSTEMS AND METHODS OF SILENT MULTI-GRADIENT ECHO DYNAMIC MAGNETIC RESONANCE IMAGING", which are herein incorporated by reference in their entirety.

The present disclosure provides systems and methods for improved silent multi-gradient echo magnetic resonance imaging (e.g., improved Looping Star). Looping Star encodes spatial information in a 3D radial manner, where spokes are grouped into a predetermined number of spokes per loop or segment which cumulatively form a closed polygon or loop, thereby providing gradient echo refocusing. For 3D spatial encoding, the spokes in each loop are rotated in a 3D pseudo-random manner. The predetermined number of spokes per loop is determined by an interplay of the desired resolution, TE, and bandwidth (BW). In previous implementations of Looping Star, the spokes forming the polygon/loop were always arranged in a purely 2D planar manner (e.g., same plane of a frequency space). The disclosed systems and methods arrange the spokes in each polygon/loop in a more encoding efficient manner (e.g., in a new trajectory). In particular, an out of plane oscillation is provided, which also provides extra out of plane image encoding. In addition, the disclosed systems and methods also utilize auto-calibrated parallel imaging (e.g., utilizing the acquired zero TE FID image for parallel image coil sensitivity calibration and intrinsic signal normalization). The disclosed systems and methods significantly boost spatiotemporal encoding efficiency, thereby, increasing the utility of Looping Star for diverse MR imaging applications. Also, the disclosed systems and methods enhance image quality by reducing streaking artifacts, decreasing background signal, and increasing sharpness.

The disclosed embodiments include acquiring a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes. An iteration of the FID acquisition process includes updating a magnetic field gradient based on a k-space spoke of the sequence of k-space spokes corresponding to the iteration of the FID acquisition process, applying a radiofrequency excitation pulse while preserving a total magnetic field gradient to encode the k-space spoke corresponding to the iteration of the FID acquisition process, and acquiring a first dataset corresponding to the k-space spoke corresponding to the iteration of the FID acquisition process, wherein the first dataset is at least a portion of the FID dataset. An interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space. All of these k-space spokes provide coverage of a 3D k-space by running rotations of the closed trajectory.

In certain embodiments, a first set of the k-space spokes of the sequence of k-space spokes are out of the plane in a first direction and a second set of the k-space spokes of the sequence of k-space spokes are out of the plane in a second direction that is opposite the first direction. In certain embodiments, the amplitude and the frequency of the out of plane oscillation of the spokes can vary as long as the cumulative trajectory refocuses. In certain embodiments, at least one k-space spoke of the sequence of k-space spokes is corkscrewed (thus, repeatedly moving in and out of the plane). In certain embodiments, a first set of the k-space spokes of the sequence of k-space spokes are out of the plane in a first direction and a second set of the k-space spokes of the sequence of k-space spokes are out of the plane in a second direction that is opposite the first direction, and wherein at least one k-space spoke of the sequence of k-space spokes is corkscrewed.

In certain embodiments, acquiring the first dataset begins immediately after the application of the radiofrequency excitation pulse such that the silent multi-gradient echo magnetic resonance imaging is a zero-echo time imaging sequence. In certain embodiments, the disclosed embodiments include acquiring at least a portion of a gradient echo dataset from the subject over the same sequence and the same order of k-space spokes as the FID acquisition process using the magnetic resonance scanner, wherein the portion of the gradient echo dataset is obtained by performing a gradient echo acquisition process by repeating the iterations of the FID acquisition process but without applying radiofrequency excitation. In certain embodiments, the disclosed embodiments include generating a reconstructed image from the gradient echo dataset based on both the FID dataset and the gradient echo dataset utilizing auto-calibrated parallel imaging reconstruction (e.g., conjugate gradient sensitivity encoding (cgSENSE)). In certain embodiments, the disclosed embodiments include generating coil sensitivity maps for each coil of the magnetic resonance scanner from a FID image acquired at zero echo time and utilizing the coil sensitivity maps for intrinsic normalization of the reconstructed image relative to the FID image.

In certain embodiments, the disclosed embodiments include applying a preparatory pulse sequence before the iteration of the FID acquisition process. The disclosed embodiments include acquiring two or more gradient echo datasets from the subject over the same sequence and the same order of k-space spokes as the FID acquisition process using the magnetic resonance imaging system, wherein the two or more gradient echo datasets are obtained by performing two or more respective gradient echo acquisition processes which each repeat the iterations of the FID acquisition process without applying radiofrequency excitation, and wherein the two or more respective gradient echo acquisition processes are performed sequentially.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
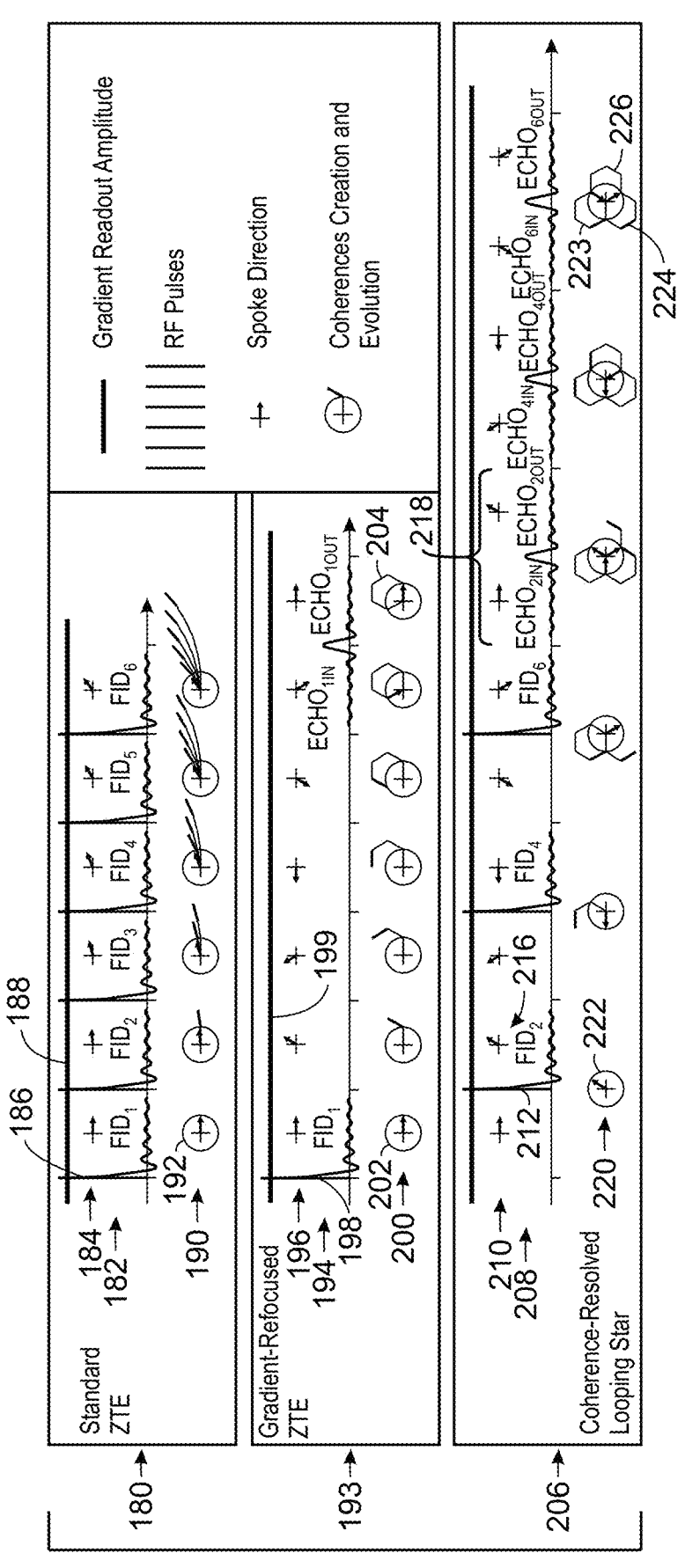
FIG. 2 illustrates a schematic diagram explaining Looping Star as a modification of standard zero echo time (ZTE) for time-multiplexed, gradient echo imaging.

FIG. 2 illustrates a schematic diagram explaining Looping Star as a modification of standard zero echo time (ZTE) for time-multiplexed, gradient echo imaging. A top row 180 of FIG. 2 illustrates standard ZTE. A top portion 182 of the top row 180 illustrates a pulse sequence 184 and associated spoke directions for standard ZTE. Standard ZTE includes hard pulse RF excitations 186 in the presence of a constant amplitude readout gradient 188. The bottom portion 190 of the top row 180 illustrates the creation and evolution signal in k-space (represented by reference numeral 192).

A middle row 193 of FIG. 2 illustrates gradient-refocused ZTE (e.g., single coherence ZTE gradient refocusing). A top portion 194 of the middle row 193 illustrates a pulse sequence 196 (and associated spoke directions) that utilizes a single pulse RF excitation 198 in the presence of a constant amplitude readout gradient 199. A bottom portion 200 of the middle row 193 illustrates formation of a self-refocusing k-space trajectory following as represented by reference numeral 202. As depicted, as an example, six spokes with an angular increment of 60 degrees result in a self-refocusing hexagonal k-space trajectory 204.

A bottom row 206 of FIG. 2 illustrates coherence-resolved Looping Star that improves the time efficiency of single-coherence gradient refocusing in the middle row 193 via time multiplexing. A top portion 208 of the bottom row

206 illustrates a pulse sequence 210 (and associated spoke directions) for a single loop that shows three RF pulses 212 exciting three signal coherences in the presence of a constant amplitude readout gradient 214. The loop may be repeated multiple times and rotated in k-space. Each single coherence provides one radial, center-out FID spoke 216 followed by a diameter in-center-out gradient echo spoke 218. Coherence-resolved Looping Star leaves a time gap during the excitation phase to provide sufficient time during the refocusing phase such that gradient echo signals (from subsequent coherences) do not overlap. A bottom portion 220 of the bottom row 206 illustrates formation of the self-refocusing k-space trajectories as represented by reference numeral 222. As depicted, as an example, three signal coherences having respective self-refocusing hexagonal space trajectories 223, 224, and 226.

Figures 3, 4:
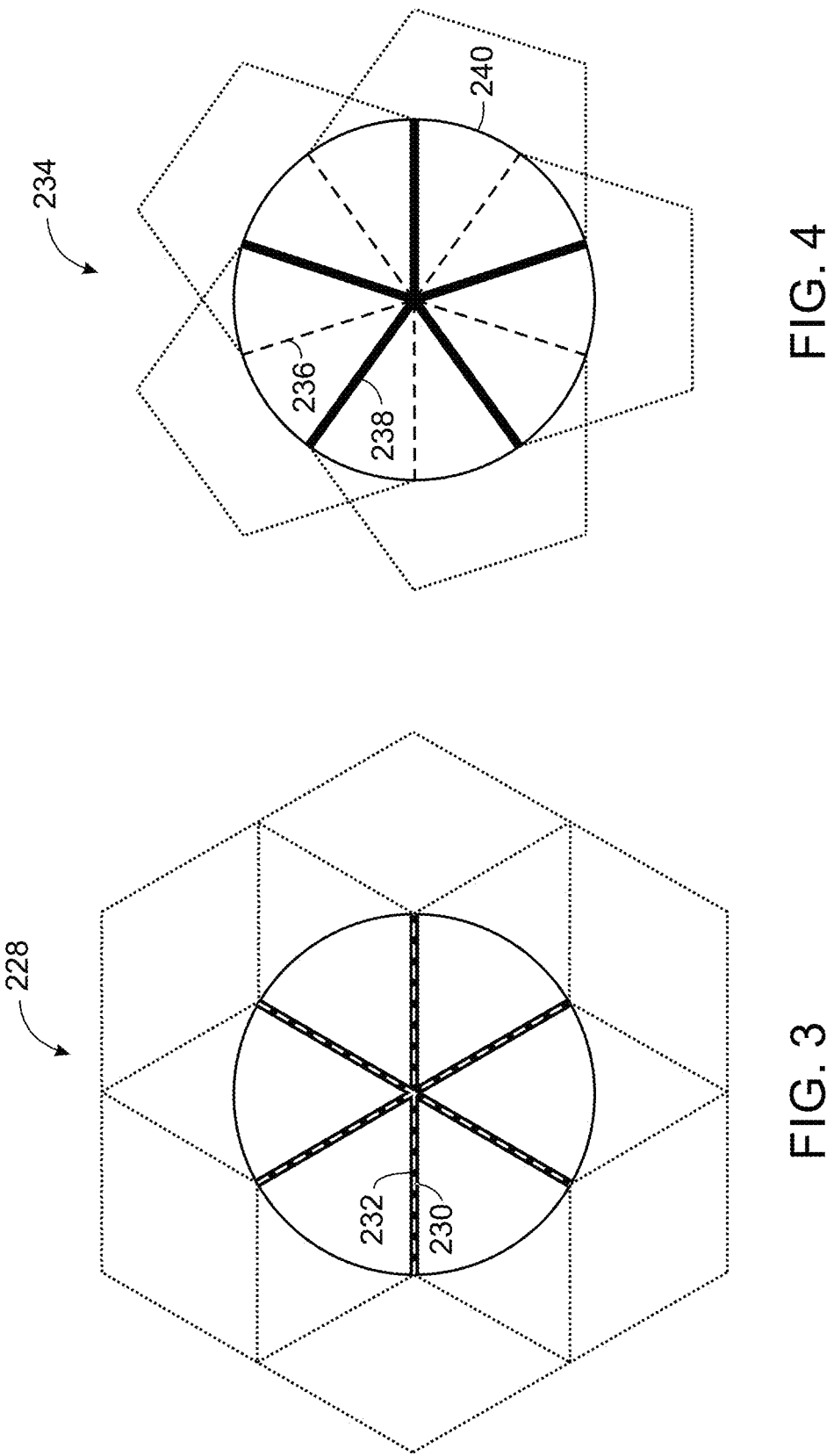
FIG. 3 illustrates a schematic diagram of a hexagonal Looping Star k-space trajectory for an even number of spokes, in accordance with aspects of the present disclosure.
FIG. 4 illustrates a schematic diagram of a pentagonal Looping Star k-space trajectory for an odd number of spokes, in accordance with aspects of the present disclosure.

FIGS. 3 and 4 illustrate different Looping Star k-space trajectories. FIG. 3 illustrates a schematic diagram of a hexagonal Looping Star k-space trajectory 228 for an even number of spokes. As depicted in FIG. 3, the loop or segment includes 6 spokes per loop to form the hexagonal Looping Star k-space trajectory 228. Utilizing an even number of spokes per loop leads to cumulative trajectories where the echo-in signals (thin dash lines 230) overlap with the echo-out signals (thick solid lines 232).

FIG. 4 illustrates a schematic diagram of a pentagonal Looping Star k-space trajectory 234 for an odd number of spokes. As depicted in FIG. 4, the loop or segment includes 5 spokes per loop to form the pentagonal Looping Star k-space trajectory 234. Utilizing an odd number of spokes per loop leads to cumulative trajectories where the echo-in signals (thin dash lines 236) and the echo-out signals (thick solid lines 238) do not overlap. This results in improved encoding efficiency (i.e., more unique spokes within the primary encoding region indicated by circle 240 having a radius of kmax=res/pi).

Typically, for a single loop or segment the trajectory for Looping Star occurs in a same plane of a frequency space. As disclosed herein, introducing or adding an adjustable out of plane oscillation (which also provides extra out of plane image encoding) improves or significantly boost spatiotemporal encoding efficiency. Looping Star with the introduces out of plane oscillation may be referred to as Wave Looping Star.

FIGS. 5-10 compare the trajectories for conventional Looping Star and Wave Looping Star. In FIGS. 5-10, a high number of spokes per loop (e.g., 26 spokes per loop) are utilized as is typical for fMRI (e.g., silent BOLD Looping Star fMRI). In order to achieve sufficient temporal resolution for fMRI, relatively few loops per volume are scanned (e.g., 32 loops per volume). Due to relatively fewer loops per volume, it is important that each loop provides optimal encoding (e.g., with Wave Looping Star). In FIGS. 9-10, only the end points of the spokes are illustrated.

FIG. 5 illustrates a schematic diagram of a conventional Looping Star trajectory 242 for a single loop in 3D k-space. As depicted, each of the spokes 244 are located in a single two-dimensional (2D) plane 246. FIG. 6 illustrates a schematic diagram of a Wave Looping Star trajectory 247 for a single loop in 3D k-space. The Wave Looping Star trajectory 247 has extra out of plane encoding (e.g., via orthogonal oscillations). The Wave Looping Star trajectory 247 includes alternates between an out of plane spoke 248 in a first direction and an out of plane spoke 250 in a second direction that is opposite the first direction. Thus, the Wave Looping Star trajectory 247 has a first set 252 of out of plane spokes 248 in the first direction and a second set 254 of out of plane spokes 250 in the second direction. Each spoke 248, 250 are curves that are going out of plane (i.e., each spoke 248, 250 start at a center and curve out of plane drawing a sinusoid at an edge of the sphere that all of the spokes 248, 250 describe). Although FIG. 6 depicts the spokes 248, 250 pushed out in opposite directions, in certain embodiments, the amplitude and the frequency of the out of plane oscillation of the spokes 248, 250 can vary as long as the cumulative trajectory refocuses.

FIG. 7 illustrates a schematic diagram of a conventional Looping Star trajectory 256 for the first three loops in 3D k-space. FIG. 8 illustrates a schematic diagram of a Wave Looping Star trajectory 258 for the first three loops in 3D k-space. FIG. 9 illustrates a schematic diagram of a conventional Looping Star trajectory 260 for one 3D imaging volume (containing 32 k-space loops). FIG. 10 illustrates a schematic diagram of a Wave Looping Star trajectory 262 for one imaging volume (containing 32 k-space loops). In FIGS. 7-10, the loops are rotated pseudo-randomly in 3D k-space. As can be seen in comparing the conventional Looping Star trajectory to the Wave Looping Star trajectory (in particular, for the obtained sampling patterns in FIGS. 7-10), Wave Looping Star provides significantly improved encoding efficiency with more uniformly distributed sampling positions.

Figure 11:
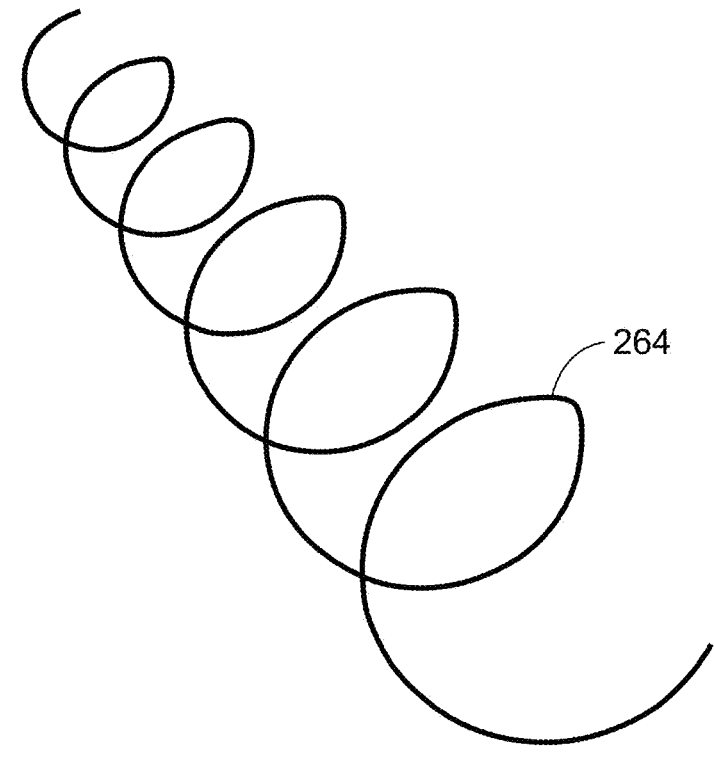
FIG. 11 illustrates a perspective view of a corkscrew-shaped spoke, in accordance with aspects of the present disclosure.
Figure 12:
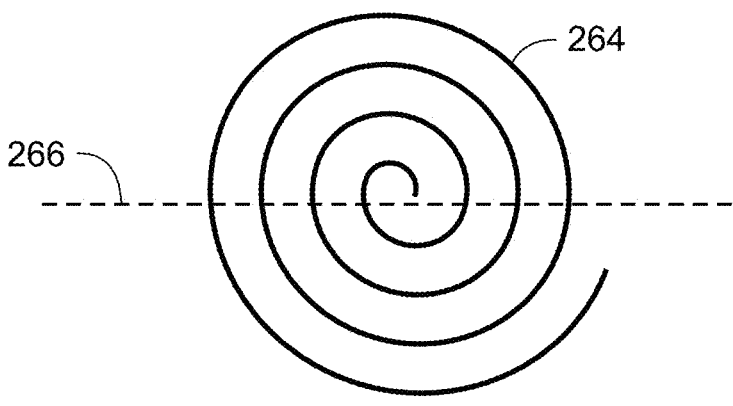
FIG. 12 illustrates an end view of the corkscrew-shape spoke in FIG. 11, in accordance with aspects of the present disclosure.

As depicted in FIGS. 2-4 the spokes may be straight. In certain embodiments, the spokes may be bent (e.g., FIGS. 5-6). In order to further improve encoding efficiency, a spoke 264 may even be corkscrewed as depicted in FIGS. 11 and 12. The individual spoke 264 itself oscillates into and out of a plane 266. The corkscrewed spoke 264 may result in louder acoustic noise. In certain embodiments, one or more of the spokes in the Wave Looping Star trajectory may be corkscrewed. In certain embodiments, one or more of the spokes being corkscrewed may be utilized in combination with a set of spokes out of plane in a first direction and a set of spokes out of the plane in a second direction that is opposite the first direction (e.g., depicted in FIG. 6).

Conventional Looping Star image reconstruction is based on 3D gridding (e.g., nnGRID), followed by Fourier transformation and root-sum-of-square coil combination. As disclosed herein, auto-calibrated parallel imaging reconstruction may be utilized in combination with wave Looping Star to further enhance overall image encoding efficiency. For example, non-Cartesian, conjugate-gradient sensitivity encoding (cgSENSE) including coil compression and noise pre-whitening may be utilized. FID images of each coil (at TE=0) may serve as pseudo coil sensitivities (coil sensitivity maps) thereby providing intrinsic normalization of the reconstructed images (i.e., normalized relative to the complex FID image) such that the obtained GRE images can be used directly for quantitative T2* and/or susceptibility mapping. Since Looping Star acquires FID and GRE data simultaneously and with identical spatial resolution and coverage, the FID pseudo coil sensitivity maps perfectly match the GRE images without being affected by spatiotemporal incongruity due to motion, geometric distortions, or resampling errors.

Figure 13:
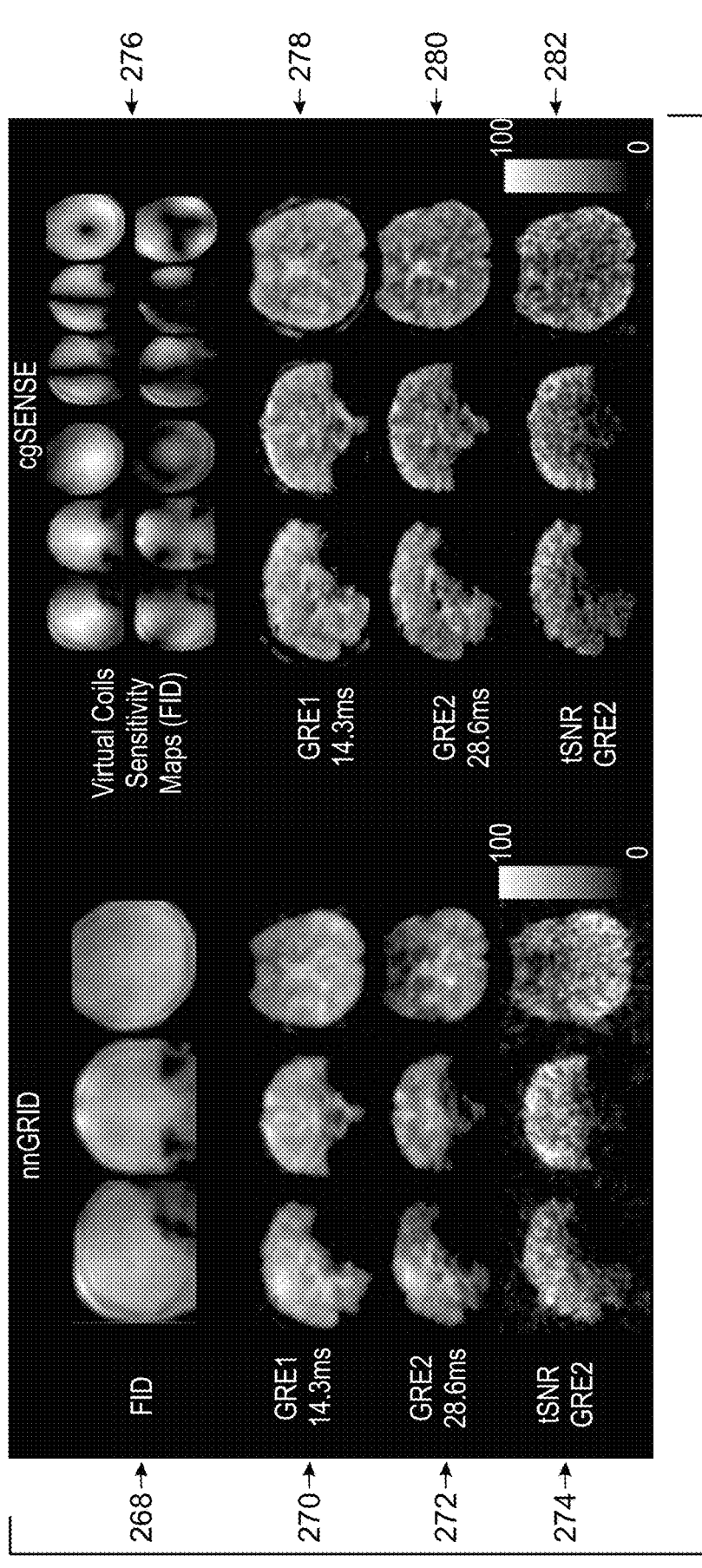
FIG. 13 depicts images from Looping Star functional MRI scans reconstructed with 3D nearest-neighbor gridding (nnGRID) and conjugate-gradient sensitivity encoding (cgSENSE), in accordance with aspects of the present disclosure.

FIG. 13 illustrates images from Looping Star fMRI scans (e.g., FID +2 GRE Looping Star fMRI) reconstructed with 3D nearest-neighbor gridding (nnGRID) and conjugate-gradient sensitivity encoding (cgSENSE). The conditions for the Looping Star fMRI scans were TE=[0, 14.3, 28.6] milliseconds (ms), resolution=3 millimeters (mm), bandwidth=±41.625 KHz, FA-2°, and time/volume=2.2 seconds. A first row 268 of the left side of FIG. 13 depicts FID images (e.g., sagittal, coronal, and axial views of the brain) obtained from three fMRI series and reconstructed with nnGRID. A second row 270 of the left side of FIG. 13 depicts sagittal, coronal, and axial GRE (GRE1) images of the brain at TE=14.3 ms reconstructed with nnGRID. A third row 272 of the left side of FIG. 13 depicts sagittal, coronal, axial GRE (GRE2) images of the brain at TE=28.6 ms reconstructed with nnGRID. A fourth row 274 of the left side of FIG. 13 depicts sagittal, coronal, and axial temporal signal-to-noise ratio (tSNR) maps for the last echo (i.e., GRE2) reconstructed with nnGRID.

A first row 276 of the right side of FIG. 13 depicts the absolute value of the FID-based coil sensitivity maps of the brain obtained from the first twelve virtual coils after coil compression for utilization with cgSENSE reconstruction. A second row 278 of the right side of FIG. 13 depicts sagittal, coronal, and axial GRE (GRE1) images of the brain at TE=14.3 ms reconstructed with cgSENSE. A third row 280 of the right side of FIG. 13 depicts sagittal, coronal, axial GRE (GRE2) images of the brain at TE=28.6 ms reconstructed with cgSENSE reconstruction. A fourth row 282 of the right side of FIG. 13 depicts sagittal, coronal, and axial temporal signal-to-noise ratio (tSNR) maps for the last echo (i.e., GRE2) reconstructed with cgSENSE reconstruction. As depicted in FIG. 13, enhanced image quality is obtained with auto-calibrated cgSENSE reconstruction as shown by reduced streaking artifacts, decreased background signal, and increased sharpness. Also, more uniform tSNR maps are obtained for cgSENSE (although with reduced magnitude).

Figure 14:
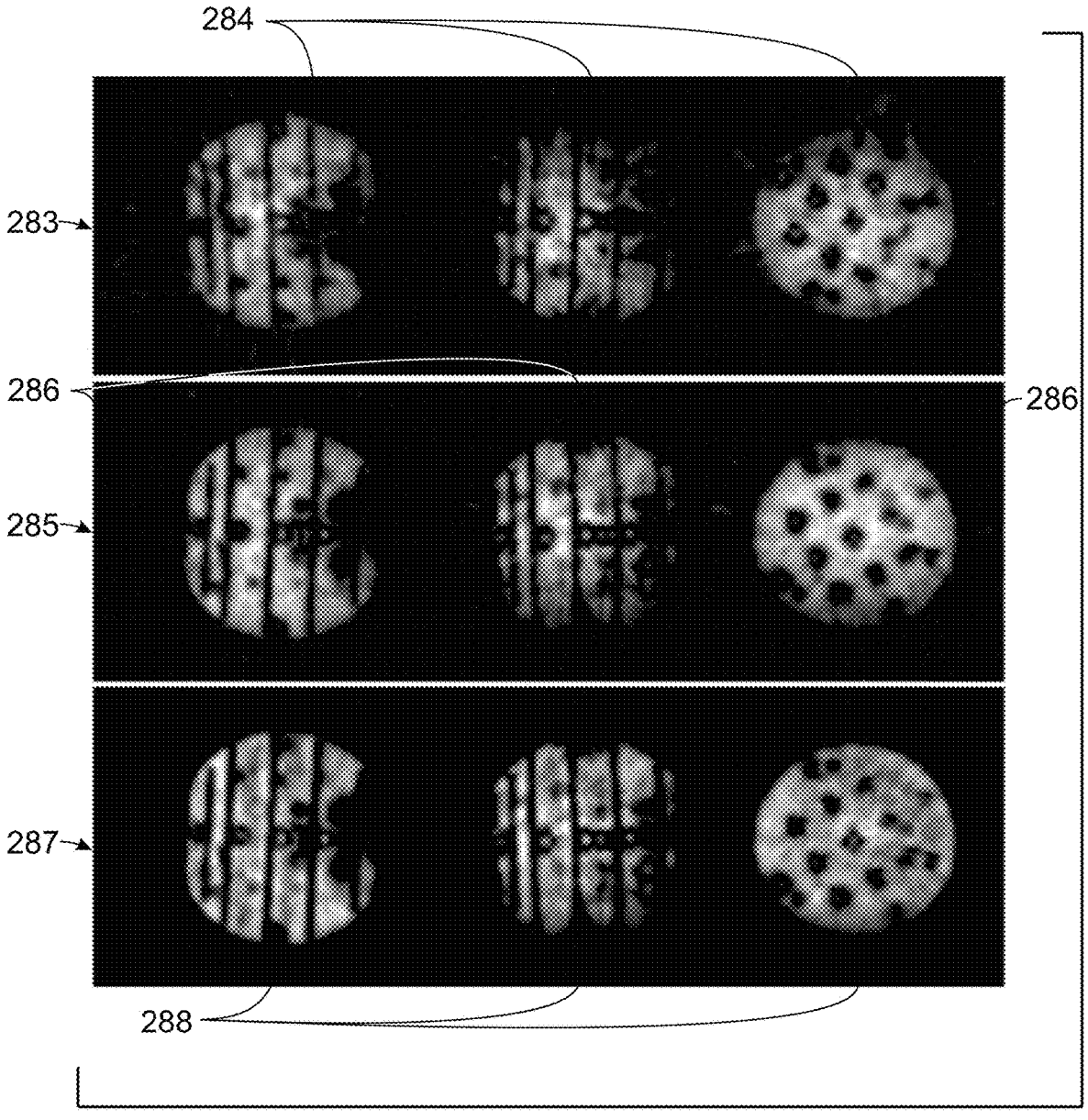
FIG. 14 depicts images from conventional Looping Star (with nnGRID reconstruction), Wave Looping Star (with nnGRID reconstruction), and wave Looping Star (with cgSENSE reconstruction) of a phantom, in accordance with aspects of the present disclosure.

FIG. 14 depicts images from conventional Looping Star, Wave Looping Star, and wave Looping Star (with cgSENSE reconstruction) of a phantom. The scans for both conventional (coherence-resolved) Looping Star and Wave Looping Star utilize 26 spokes per loop and 32 loops per scanning volume for a total of 832 spokes per volume. A top row 283 of different images 284 of the phantom are derived from conventional Looping Star with conventional reconstruction (nnGRID reconstruction). Significant streaking artifacts are present in the images 284 due to undersampling. A middle row 285 of different images 286 of the phantom (corresponding to the images 284) are derived from Wave Looping Star with conventional reconstruction (nnGRID reconstruction). The images 286 have improved encoding and correspondingly reduced streaking compared to the images 284. A bottom row 287 of different images 288 of the phantom (corresponding to the images 284 and 286) are derived from Wave Looping Star with auto-calibrated parallel imaging reconstruction (in particular, cgSENSE). The images 288 have further improved image quality compared to both the images 284 and 286. For the cgSENSE reconstruction of the image 288, coil sensitivity maps derived from the FID image at TE=0 were utilized. These coil sensitivity maps have the ideal characteristics for coil sensitivity calibration for the reasons noted above.

Figure 15:
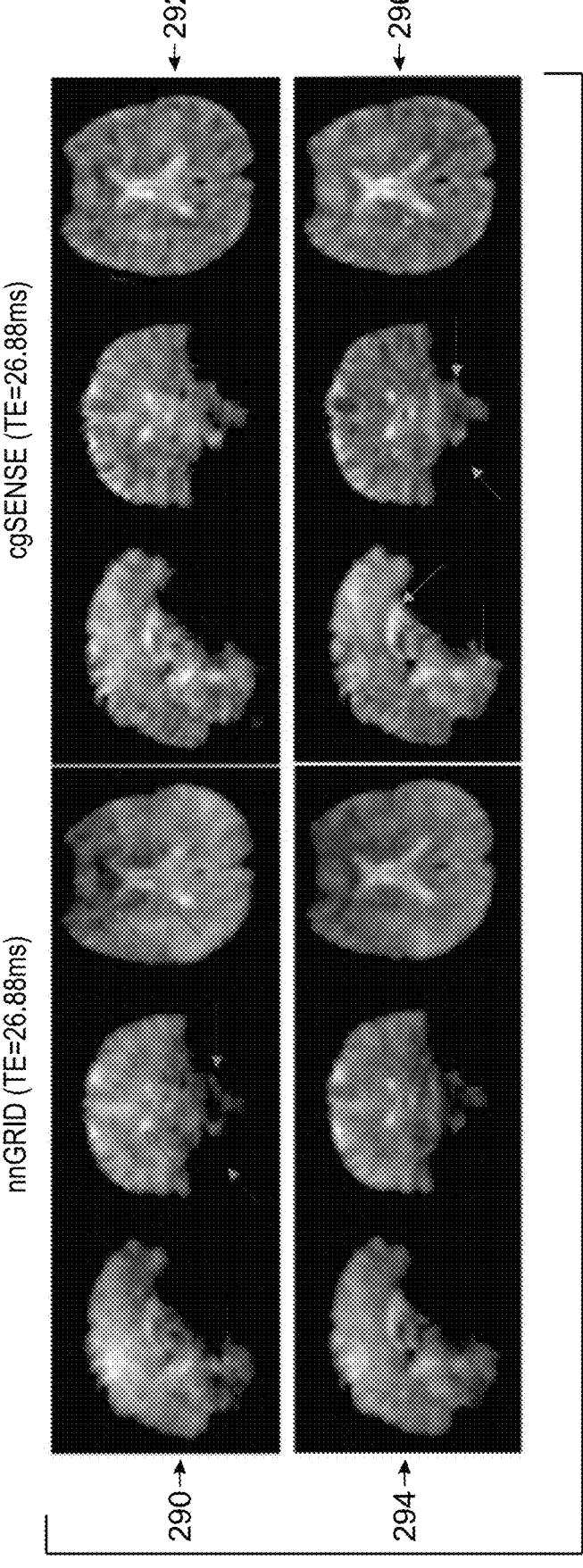
FIG. 15 depicts images from conventional Looping Star and Wave Looping Star reconstructed utilizing both nnGRID and cgSENSE, in accordance with aspects of the present disclosure.

FIG. 15 depicts images (fMRI images) from conventional Looping Star and Wave Looping Star reconstructed utilizing both nnGRID and cgSENSE. The fMRI images are derived from a typical fMRI acquisition with following conditions: TE=26.88 ms, resolution=(3 mm)³, bandwidth=±41.625 KHz, FA=2°, and time/volume=2.7 seconds. Top left row 290 of FIG. 15 includes sagittal, coronal, and axial fMRI images of the brain acquired utilizing conventional Looping Star at TE=[0, 26.88 ms] and reconstructed utilizing nnGRID. Top right row 292 of FIG. 15 includes sagittal, coronal, and axial fMRI images of the brain acquired utilizing conventional Looping Star at TE=[0, 26.88 ms] and reconstructed utilizing cgSENSE. Bottom left row 294 of FIG. 15 includes sagittal, coronal, and axial fMRI images of the brain acquired utilizing Wave Looping Star at TE=[0, 26.88 ms] and reconstructed utilizing nnGRID. Bottom right row 296 of FIG. 15 includes sagittal, coronal, and axial fMRI images of the brain acquired utilizing Wave Looping Star at TE=[0, 26.88 ms] and reconstructed utilizing cgSENSE. Comparing the arrows in the images in the top left row 290 to the corresponding arrows in the bottom right row 296 shows that the best image quality is obtained with the combination of Wave Looping Star encoding and cgSENSE reconstruction.

Figure 16:
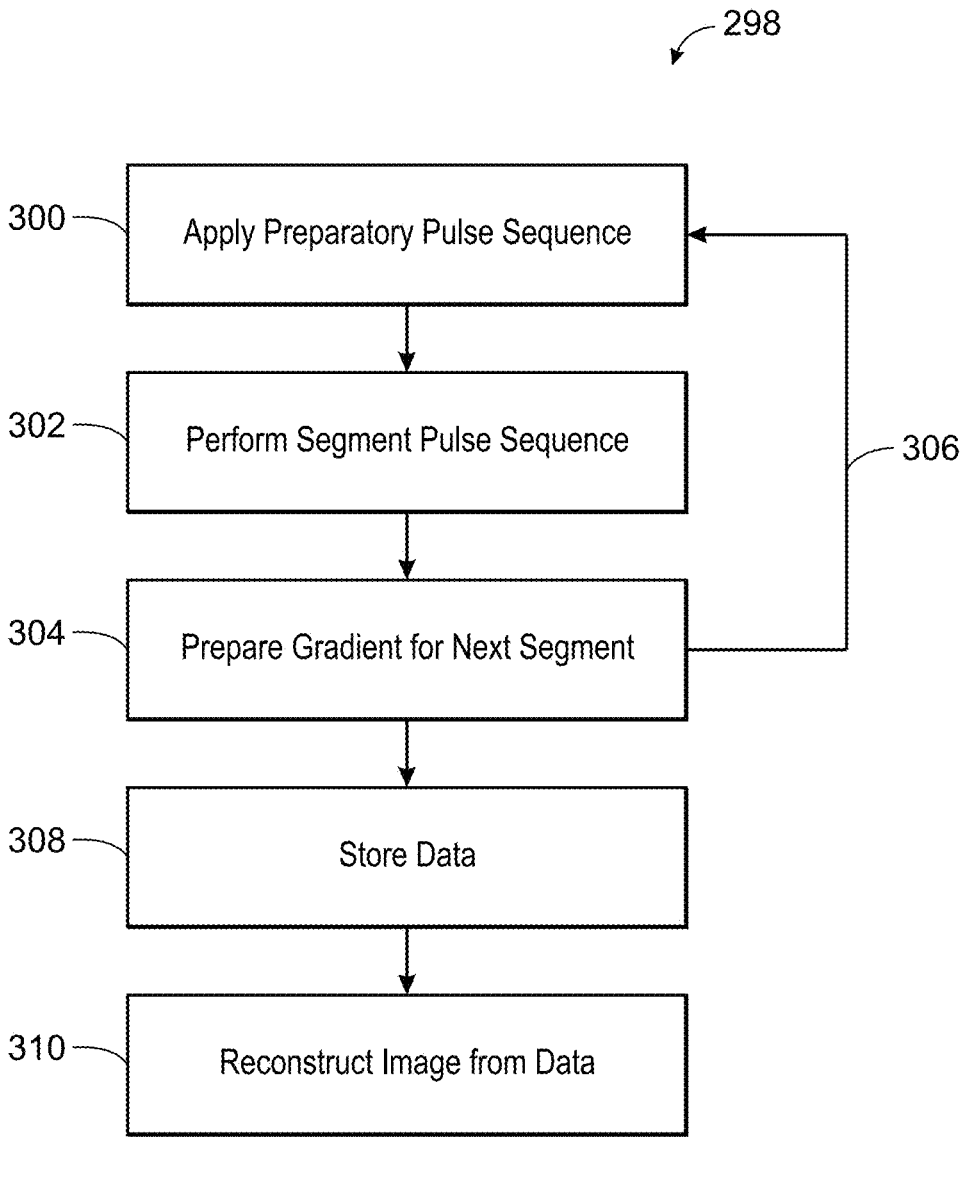
FIG. 16 illustrates a flow chart of a method for performing a silent multi-gradient echo magnetic resonance imaging, in accordance with aspects of the present disclosure.

FIG. 16 illustrates a flow chart of a method 298 for performing a silent multi-gradient echo magnetic resonance imaging. One or more steps of the method 298 may be performed by processing circuitry of the magnetic resonance imaging system 100 in FIG. 1 or a remote computing system. One or more of the steps of the method 298 may be performed simultaneously or in a different order from the order depicted in FIG. 16.

With an object inside the MRI system, a preparatory pulse sequence (block 300) may be applied. The preparatory pulse sequence (block 300) may include a sequence of RF excitation pulses that may prepare the magnetization of the gyromagnetic nuclei of the imaged object for improved data acquisition. The preparatory pulse sequence (block 300) may include a pulse sequence for selection of a spatial volume of the object to be imaged. In certain embodiments, the preparatory pulse sequence (block 300) may also prepare the sample to optimize the production of data suitable for the production of T1, T2 or T2*-weighted images. The preparatory pulse sequence (block 300) may be used prior to the collection of data associated with each self-refocusing segment.

A self-refocusing segment pulse sequence (block 302) may then be performed. As detailed below, the segment pulse sequence (block 302) may include a sequential application of gradient updates, multiple RF excitation pulses, and data acquisition cycles. The segment pulse sequence (block 302) may sample data through multiple k-space spokes via an acquisition trajectory having a closed geometry (e.g., a looping acquisition trajectory). As described above, the k-space spokes of the sequence of k-space spokes oscillate in and out of a plane of a frequency space. In certain embodiments, a first set of the k-space spokes of the sequence of k-space spokes are out of the plane in a first direction and a second set of the k-space spokes of the sequence of k-space spokes are out of the plane in a second direction that is opposite the first direction. In certain embodiments, the amplitude and the frequency of the out of plane oscillation of the spokes can vary as long as the cumulative trajectory refocuses. In certain embodiments, at least one k-space spoke of the sequence of k-space spokes is corkscrewed (thus, repeatedly moving in and out of the plane). In certain embodiments, a first set of the k-space spokes of the sequence of k-space spokes are out of plane the plane in a first direction and a second set of the k-space spokes of the sequence of k-space spokes are out of the plane in a second direction that is opposite the first direction, and wherein at least one k-space spoke of the sequence of k-space spokes is corkscrewed. The segment pulse sequence (block 302) may be used to obtain FID and gradient echo data related to the k-space region associated with the segment pulse sequence (block 302).

In order to cover a desired k-space volume, data corresponding to multiple k-space segments may be acquired through an iterative process. To that end, a magnetic field gradient that prepares the object for the acquisition of a next k-space segment may be applied (block 304), followed by an iteration (block 306). Each iteration may include an application of a preparatory pulse sequence (block 306), the segment pulse sequence (block 302) corresponding to a k-space segment, and an application of a magnetic field gradient for the next segment (block 304). In some embodiments, the preparatory pulse sequence (block 300) may be skipped for time reduction, for example if the type of image being generated does not necessarily require preparatory pulses. In embodiments where a repetition or a re-sampling of the data corresponding to a previously acquired segment is desired, the gradient preparation (block 304) may preserve the initial magnetic field gradient employed. The data acquired during the multiple segment pulse sequences (block 302) may be stored in a memory (block 308) (e.g., in memory circuitry 170). In some implementations, the data may be stored during or following each completion of an iteration (block 306). The stored data may be saved in a memory for posterior usage, such as to perform image reconstruction (block 310). The image reconstruction (block 310) may include generating a reconstructed image from the gradient echo dataset based on both the FID dataset and the gradient echo dataset utilizing for example auto-calibrated parallel imaging reconstruction (e.g., cgSENSE). In particular, the image reconstruction (block 310) may include generating coil sensitivity maps for each coil of the MR scanner from a FID image acquired at zero echo time (TE=0) and utilizing the FID-based coil sensitivity maps for intrinsic normalization of the reconstructed image relative to the complex FID image.

As discussed above, the method 298 may be used to acquire data associated with regions of k-space through multiple segment pulse sequences. The acts performed in accordance with each segment pulse sequence (block 302) may be further appreciated with respect to FIG. 17, which illustrates a method 312 of performing a self-refocusing segment pulse sequence to acquire data associated with a segment of k-space. One or more steps of the method 312 may be performed by processing circuitry of the magnetic resonance imaging system 100 in FIG. 1 or a remote computing system. One or more of the steps of the method 312 may be performed simultaneously or in a different order from the order depicted in FIG. 17. It should be noted that the methods 298 and 312 may be utilized in conjunction with fMRI.

Figure 17:
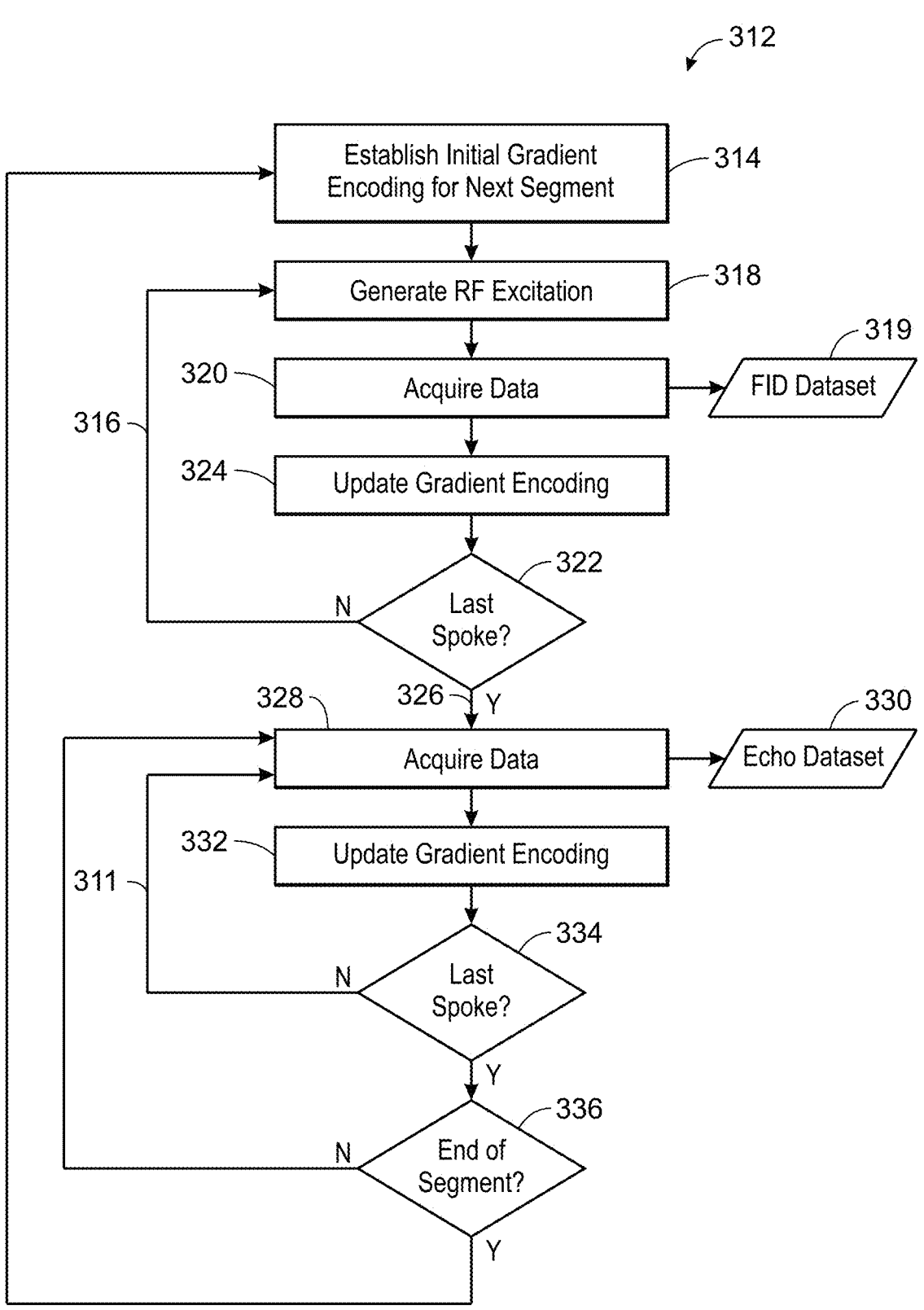
FIG. 17 illustrates a flow chart of a method to produce a self-refocusing multi-gradient encoding sequence utilized with the method in FIG. 16, in accordance with aspects of the present disclosure.

In the description of FIG. 17 herein, the term "loop" should be understood as a repeated portion of a method. An initial setup stage includes the initialization of the loop counter which tracks the iterations within a segment, and gradient encoding and initialization of a spoke counter which tracks the k-space spokes being sampled (block 314). The gradient encoding may be established through the gradient coils of the MRI system 100 of FIG. 1. The amplitude of the gradient encoding established in accordance with block 314 may remain essentially the same through the pulse sequence for each segment of k-space being sampled (e.g., including a plurality of spokes).

As described above, a segment pulse sequence may be used to obtain FID and gradient echo datasets corresponding to a segment of k-space formed by multiple spokes. The method 312 may include an FID acquisition process in the first acquisition process of the segment, i.e. when the loop counter is 1 (connector 316). In this FID acquisition process, an application of an RF excitation (block 318), followed by acquisition of FID data 319 (block 320) may take place. The process is repeated for each k-space spoke until all spokes are covered during the FID acquisition process, as represented by the YES connector from decision block 322. To obtain data related to the next k-space spoke of the sequence, the encoding gradient may be updated (block 324) and the spoke counter may be incremented.

During each FID acquisition process, the RF excitation (block 318) may be applied (e.g., using RF coil 136 of FIG. 1). The RF excitation 318 may be a short non-selective RF excitation. The RF excitation may lead to precession of the gyromagnetic nuclei around the local magnetic field. In some implementations, the RF excitation (block 318) may lead to an angle between the gyromagnetic spin axis and the local magnetic field that is substantially smaller than 90°.

Following the RF excitation (block 318), the acquisition coils (e.g., acquisition coil 38 of FIG. 1) may be set to acquire FID data 319 (block 320) to obtain a portion of the FID dataset 319 corresponding to the k-space spoke being sampled in the present iteration. The acquisition (block 320) may take place immediately after the application of the RF excitation (block 318), resulting in a FID dataset 319 with TE=0 or a TE that is substantially small (e.g., negligible).

A gradient encoding update (block 324) may be used to prepare the spoke corresponding to the next iteration of the FID acquisition process. The gradient encoding update (block 324) may be a small change to the magnetic field gradient. Thus, the gradient update causes only a slight change in the currents of the gradient coils, enabling quiet operation of the system 100. In some embodiments, the gradient encoding update performed in accordance with the acts represented by block 324 may also take place in smaller steps, for example concurrently with data acquisition (block 320).

The FID acquisition process ends once all k-space spokes have been sampled, as represented by connector NO 316 from decision block 322. Completion of the k-space spokes corresponding to the segment being sampled in the FID acquisition process may form a loop geometry, as discussed above. This loop geometry, in certain implementations, may result in signal refocusing, which can be used to collect additional echo signals. More specifically and by way of example, the sequential spatial encoding from the series of RF excitation pulses (block 318) and gradient updates (block 324) performed during the FID acquisition process (i_loop=1 in the example) may result in the refocusing of the signal associated with the RF excitation pulse (block 318) from the first iteration (i_spoke=1) of the FID acquisition process after the last spoke (i_spoke=number of spokes per loop). Moreover, a subsequent application of gradient updates (block 324) corresponding to the sequence of k-space spokes used in the first iterative process (i_loop=1) may provide a sequence of refocused signals associated with the RF excitations (block 318) applied in the FID acquisition process.

As illustrated by the YES connector 326, a first gradient echo acquisition process 328 may follow a gradient update (block 324). Refocusing from subsequent gradient updates corresponding to the RF excitation (block 318) sampled in the FID acquisition process (i_loop=1) may provide gradient echo data 330 that may be acquired (block 328). The gradient updates (block 332) in a gradient echo acquisition process (i_loop>1) may substantially follow the sequence of gradient updates of the FID acquisition process (i_loop=1). As a result, the k-space trajectory during a gradient echo acquisition process may substantially retrace the k-space trajectory during the FID acquisition process. Thus, as described above, the k-space spokes of the sequence of k-space spokes oscillate in and out of a plane of a frequency space. In certain embodiments, a first set of the k-space spokes of the sequence of k-space spokes are out of the plane in a first direction and a second set of the k-space spokes of the sequence of k-space spokes are out of the plane in a second direction that is opposite the first direction. In certain embodiments, the amplitude and the frequency of the out of plane oscillation of the spokes can vary as long as the cumulative trajectory refocuses. In certain embodiments, at least one k-space spoke of the sequence of k-space spokes is corkscrewed (thus, repeatedly moving in and out of the plane). In certain embodiments, a first set of the k-space spokes of the sequence of k-space spokes are out of the plane in a first direction and a second set of the k-space spokes of the sequence of k-space spokes are out of the plane in a second direction that is opposite the first direction, and wherein at least one k-space spoke of the sequence of k-space spokes is corkscrewed.

As described above, each iteration of a gradient echo acquisition process has a corresponding iteration in the FID acquisition process. At the beginning of each iteration of the first gradient echo acquisition process, the signal from the RF excitation (block 318) of the corresponding iteration of the FID acquisition process may be refocused. Data acquisition at the beginning of each iteration (block 328) provides a portion of a first gradient echo dataset 330 corresponding to the k-space spoke associated with the iteration. As an example, if a FID dataset of a first spoke is acquired in a first iteration of the FID acquisition process (i_loop=1 and i_spoke=1), the corresponding gradient echo dataset 330 for that first spoke may be acquired in a first iteration of the first gradient echo acquisition process (i_loop=2 and i_spoke=1). The resulting echo time may be TE=TE1, wherein TE1 is substantially the same as the duration of the FID acquisition process.

A gradient update (block 332) corresponding to the next spoke in the sequence of spokes may be applied to obtain the next echo. The magnitude and the orientation of the sequence of gradient updates (block 332, when i_loop>1) may be substantially similar to the sequence of gradient updates (block 324, when i_loop=1) of the FID acquisition process. Moreover, the interval between gradient updates (block 332, when i_loop>1) may be substantially similar to the interval between gradient updates (block 34, when i_loop>1) of the FID acquisition process. As a result, the sequence of spokes sampled in the FID acquisition process may be substantially similar to the sequence of spokes sampled in the first gradient echo acquisition process, both in order as well as in dimensions. In this way, the set of gradient echo datasets obtained in the first gradient echo acquisition process (block 328) correspond to the FID datasets obtained in the FID acquisition process (block 320). The iterations of the gradient echo acquisition process continue until all k-space spokes corresponding to the segment are acquired, as represented by decision block 334.

In some implementations, multiple gradient echo acquisition processes substantially similar to the first gradient echo acquisition process may be used to obtain multiple gradient echo dataset corresponding to the same k-space segment. This may be represented by an instance of method 312 where the number of loops is greater than 2. As illustrated by decision block 336, if more gradient echo datasets within the segment is desired (i.e., number of loops>2), gradient echo acquisition process may be repeated. For example, a second gradient echo dataset (i_loop=3) may be acquired by performing a second gradient echo acquisition immediately following the first gradient echo acquisition process (i_loop=2). The resulting echo time for the second gradient echo dataset may be TE=2*TE1, wherein TE1 is substantially similar to the duration of the FID acquisition process. As another example, a self-refocusing pulse sequence may include a FID acquisition process (i_loop=1) to obtain a first FID dataset, a first gradient echo acquisition process (i_loop=2) to obtain a first gradient echo dataset, a second gradient echo acquisition process (i_loop=3) similar to the first gradient echo acquisition process to obtain a second gradient echo dataset and a third gradient echo acquisition process (i_loop=4) similar to the first gradient echo acquisition process to obtain a third gradient echo dataset. Since the RF excitation (block 318) takes place in the FID acquisition process, the second, the third and the fourth gradient echo dataset may be used with the FID dataset (without further RF excitation) to improve the measure of the T2* relaxation times and susceptibility information, depending on the desired image weighting. Moreover, quantification and production of T2* and/or susceptibility maps and other images may use only a sub-selection of the acquired gradient echo and FID dataset.

Technical effects of the disclosed subject matter include improving silent multi-gradient echo magnetic resonance imaging (e.g., improved Looping Star). Technical effects of the disclosed subject matter include arranging the spokes in each polygon/loop in a more encoding efficient manner (e.g., in a new trajectory). In particular, an out of plane oscillation is provided, which also provides extra out of plane image encoding. Technical effects of the disclosed subject matter include utilizing auto-calibrated parallel imaging (e.g., utilizing the acquired zero TE FID image for parallel image coil sensitivity calibration and intrinsic signal normalization). Technical effects of the disclosed subject matter include significantly boosting spatiotemporal encoding efficiency, thereby, increasing the utility of Looping Star for diverse MR imaging applications. Also, technical effects of the disclosed subject matter include enhancing image quality by reducing streaking artifacts, decreasing background signal, and increasing sharpness.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for silent multi-gradient echo magnetic resonance imaging, comprising:

acquiring, via a processor, a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a three-dimensional k-space, and wherein an iteration of the FID acquisition process comprises:

updating a magnetic field gradient based on a k-space spoke of the sequence of k-space spokes corresponding to the iteration of the FID acquisition process;

applying a radiofrequency excitation pulse while preserving a total magnetic field gradient to encode the k-space spoke corresponding to the iteration of the FID acquisition process; and acquiring a first dataset corresponding to the k-space spoke corresponding to the iteration of the FID acquisition process, wherein the first dataset is at least a portion of the FID dataset; and wherein an interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

2. The computer-implemented method of claim 1, wherein a first set of the k-space spokes of the sequence of k-space spokes are out of the plane in a first direction and a second set of the k-space spokes of the sequence of k-space spokes are out of the plane in a second direction that is opposite the first direction.

3. The computer-implemented method of claim 1, wherein at least one k-space spoke of the sequence of k-space spokes is corkscrewed.

4. The computer-implemented method of claim 1, wherein a first set of the k-space spokes of the sequence of k-space spokes are out of the plane in a first direction and a second set of the k-space spokes of the sequence of k-space spokes are out of the plane in a second direction that is opposite the first direction, and wherein at least one k-space spoke of the sequence of k-space spokes is corkscrewed.

5. The computer-implemented method of claim 1, wherein acquiring the first dataset begins immediately after the application of the radiofrequency excitation pulse such that the silent multi-gradient echo magnetic resonance imaging is a zero-echo time imaging sequence.

6. The computer-implemented method of claim 5, further comprising acquiring, via the processor, at least a portion of a gradient echo dataset from the subject over the same sequence and the same order of k-space spokes as the FID acquisition process using the magnetic resonance scanner, wherein the portion of the gradient echo dataset is obtained by performing a gradient echo acquisition process by repeating the iterations of the FID acquisition process but without applying radiofrequency excitation.

7. The computer-implemented method of claim 6, further comprising generating, via the processor, a reconstructed image from the gradient echo dataset based on both the FID dataset and the gradient echo dataset utilizing auto-calibrated parallel imaging reconstruction.

8. The computer-implemented method of claim 7, further comprising:

generating coil sensitivity maps for each coil of the magnetic resonance scanner from a FID image acquired at zero echo time; and utilizing the coil sensitivity maps for intrinsic normalization of the reconstructed image relative to the FID image.

9. The computer-implemented method of claim 1, further comprising applying, via the processor, a preparatory pulse sequence before the iteration of the FID acquisition process.

10. The computer-implemented method of claim 1, further comprising acquiring, via the processor, two or more gradient echo datasets from the subject over the same sequence and the same order of k-space spokes as the FID acquisition process using the magnetic resonance imaging system, wherein the two or more gradient echo datasets are obtained by performing two or more respective gradient echo acquisition processes which each repeat the iterations of the FID acquisition process without applying radiofrequency excitation, and wherein the two or more respective gradient echo acquisition processes are performed sequentially.

11. A system for silent multi-gradient echo magnetic resonance imaging, comprising:
  a memory encoding processor-executable routines; and
  a processor configured to access the memory and to execute the processor-executable routines, wherein the processor-executable routines, when executed by the processor, cause the processor to:
    acquire a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a three-dimensional k-space, and wherein an iteration of the FID acquisition process comprises:
      updating a magnetic field gradient based on a k-space spoke of the sequence of k-space spokes corresponding to the iteration of the FID acquisition process;
      applying a radiofrequency excitation pulse while preserving a total magnetic field gradient to encode the k-space spoke corresponding to the iteration of the FID acquisition process; and
      acquiring a first dataset corresponding to the k-space spoke corresponding to the iteration of the FID acquisition process, wherein the first dataset is at least a portion of the FID dataset; and
    wherein an interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

12. The system of claim 11, wherein a first set of the k-space spokes of the sequence of k-space spokes are out of the plane in a first direction and a second set of the k-space spokes of the sequence of k-space spokes are out of the plane in a second direction that is opposite the first direction.

13. The system of claim 11, wherein at least one k-space spoke of the sequence of k-space spokes is corkscrewed.

14. The system of claim 11, wherein a first set of the k-space spokes of the sequence of k-space spokes are out of the plane in a first direction and a second set of the k-space spokes of the sequence of k-space spokes are out of the plane in a second direction that is opposite the first direction, and wherein at least one k-space spoke of the sequence of k-space spokes is corkscrewed.

15. The system of claim 11, wherein acquiring the first dataset begins immediately after the application of the radiofrequency excitation pulse such that the silent multi-gradient echo magnetic resonance imaging is a zero-echo time imaging sequence.

16. The system of claim 15, wherein the routines, when executed by the processor, further cause the processor to acquire at least a portion of a gradient echo dataset from the subject over the same sequence and the same order of k-space spokes as the FID acquisition process using the magnetic resonance scanner, wherein the portion of the gradient echo dataset is obtained by performing a gradient echo acquisition process by repeating the iterations of the FID acquisition process but without applying radiofrequency excitation.

17. The system of claim 16, wherein the routines, when executed by the processor, further cause the processor to generate a reconstructed image from the gradient echo dataset based on both the FID dataset and the gradient echo dataset utilizing auto-calibrated parallel imaging reconstruction.

18. The system of claim 17, wherein the routines, when executed by the processor, further cause the processor to:
  generate coil sensitivity maps for each coil of the magnetic resonance scanner from a FID image acquired at zero echo time; and
  utilize the coil sensitivity maps for intrinsic normalization of the reconstructed image relative to the FID image.

19. A non-transitory computer-readable medium, the computer-readable medium comprising processor-executable code that when executed by a processor, causes the processor to:
  acquire a free induction decay (FID) dataset from a subject using a magnetic resonance scanner, wherein the FID dataset is obtained by performing a free induction decay (FID) acquisition process over iterations, each iteration corresponding to a k-space spoke of a sequence of k-space spokes in a three-dimensional k-space, and wherein an iteration of the FID acquisition process comprises:
    updating a magnetic field gradient based on a k-space spoke of the sequence of k-space spokes corresponding to the iteration of the FID acquisition process;
    applying a radiofrequency excitation pulse while preserving a total magnetic field gradient to encode the k-space spoke corresponding to the iteration of the FID acquisition process; and
    acquiring a first dataset corresponding to the k-space spoke corresponding to the iteration of the FID acquisition process, wherein the first dataset is at least a portion of the FID dataset; and
  wherein an interconnection of the k-space spokes of the sequence of k-space spokes forms a closed k-space trajectory that refocuses FID signals resulting from the application of the radiofrequency excitation pulse of an initial iteration of the FID acquisition process, wherein the k-space spokes of the sequence of k-space spokes oscillate in and out of a plane of a frequency space.

20. The non-transitory computer-readable medium of claim 19, wherein a first set of the k-space spokes of the sequence of k-space spokes are out of the plane in a first direction and a second set of the k-space spokes of the sequence of k-space spokes are out of the plane in a second direction that is opposite the first direction, at least one k-space spoke of the sequence of k-space spokes is corkscrewed, or a combination thereof.

* * * * *